(12) United States Patent
Pirih et al.

(10) Patent No.: US 12,028,978 B2
(45) Date of Patent: Jul. 2, 2024

(54) RESILIENT MICRO LATTICE ELECTRICAL INTERCONNECTION ASSEMBLY

(71) Applicant: Northrop Grumman Systems Corporation, Falls Church, VA (US)

(72) Inventors: Matthew J. Pirih, Redondo Beach, CA (US); Steven J. Mass, La Palma, CA (US); Andrew Yurko, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 110 days.

(21) Appl. No.: 17/397,314

(22) Filed: Aug. 9, 2021

(65) Prior Publication Data

US 2021/0368622 A1 Nov. 25, 2021

Related U.S. Application Data

(62) Division of application No. 16/118,892, filed on Aug. 31, 2018, now Pat. No. 11,129,277, which is a
(Continued)

(51) Int. Cl.
*H05K 1/14* (2006.01)
*B33Y 80/00* (2015.01)
(Continued)

(52) U.S. Cl.
CPC .............. *H05K 1/144* (2013.01); *B33Y 80/00* (2014.12); *H05K 3/368* (2013.01); *H05K 3/4015* (2013.01); *H05K 2201/042* (2013.01); *H05K 2201/10265* (2013.01); *H05K 2201/10348* (2013.01); *H05K 2203/0723* (2013.01); *H05K 2203/095* (2013.01); *H05K 2203/107* (2013.01)

(58) Field of Classification Search
CPC ........ H05K 1/144; H05K 3/027; H05K 3/368; H05K 3/4015; H05K 2201/09209; H05K 2201/042; H05K 2201/10265; H05K 2201/10348; H05K 2203/092; H05K 2203/0723; H05K 2203/095; H05K 2203/107; B33Y 80/00
See application file for complete search history.

(56) References Cited

U.S. PATENT DOCUMENTS 3,354,260 A * 11/1967 Brandt .................. B29C 65/601
174/265
5,228,861 A * 7/1993 Grabbe .................. H01R 12/52
439/591
(Continued)

*Primary Examiner* — Jeffrey T Carley
(74) *Attorney, Agent, or Firm* — KLINTWORTH & ROZENBLAT IP LLP

(57) ABSTRACT

An elongate, three dimensional, conductive, micro lattice truss structure has parallel layers of resilient strands so that the truss structure maintains structural integrity during end-to-end compression which shortens its uncompressed length. The resiliency of the micro lattice truss structure enables the truss structure to return to substantially its uncompressed length when the compression is removed. The truss structure is adapted to provide a resilient electrical connection between two opposing conductive areas on parallel spaced-apart printed circuit boards when the distal ends of the truss structure engage and are compressed between the two areas.

3 Claims, 3 Drawing Sheets

Related U.S. Application Data division of application No. 15/007,743, filed on Jan. 27, 2016, now Pat. No. 10,104,773.

(51) Int. Cl.
*H05K 3/36* (2006.01)
*H05K 3/40* (2006.01)

(56) References Cited

U.S. PATENT DOCUMENTS

| | | | | |
|---|---|---|---|---|
| 6,215,196 B1 * | 4/2001 | Eldridge | ............ | H01L 24/11 257/784 |
| 6,274,823 B1 * | 8/2001 | Khandros | ............ | H01L 21/563 257/E21.507 |
| 6,307,159 B1 * | 10/2001 | Soejima | ............ | H01L 24/11 174/250 |
| 6,442,039 B1 * | 8/2002 | Schreiber | ............ | H01R 13/2435 439/66 |
| 6,589,334 B2 * | 7/2003 | John | ............ | C30B 5/00 117/1 |
| 6,646,364 B1 * | 11/2003 | Horning | ............ | H02N 1/006 310/309 |
| 7,040,902 B2 * | 5/2006 | Li | ............ | H01R 12/714 257/E23.068 |
| 7,297,004 B1 * | 11/2007 | Shuhart | ............ | H01R 13/2421 439/66 |
| 7,402,051 B1 * | 7/2008 | Batish | ............ | H01R 12/52 439/91 |
| 8,803,206 B1 * | 8/2014 | Or-Bach | ............ | H01L 23/34 257/355 |
| 9,774,117 B1 * | 9/2017 | Jackson | ............ | H01L 23/49811 |
| 10,641,792 B2 * | 5/2020 | Wu | ............ | G01R 1/06761 |
| 2004/0023530 A1 * | 2/2004 | Garcia | ............ | H01R 13/2421 439/75 |
| 2004/0211592 A1 * | 10/2004 | Aoki | ............ | G02F 1/13452 345/80 |
| 2005/0118842 A1 * | 6/2005 | Perugini | ............ | H01R 13/2435 439/66 |
| 2005/0168961 A1 * | 8/2005 | Ono | ............ | H01L 25/0652 257/E25.011 |
| 2005/0202667 A1 * | 9/2005 | Cohen | ............ | G01P 15/0802 438/618 |
| 2006/0172564 A1 * | 8/2006 | Nilsson | ............ | G01R 31/70 439/66 |
| 2006/0278072 A1 * | 12/2006 | Kent | ............ | A61M 25/0021 96/4 |
| 2009/0206520 A1 * | 8/2009 | Park | ............ | G03F 7/0045 430/286.1 |
| 2013/0078860 A1 * | 3/2013 | Rathburn | ............ | H01R 12/7082 439/700 |
| 2013/0303002 A1 * | 11/2013 | Oosterhuis | ............ | B29C 64/124 29/876 |
| 2017/0094803 A1 * | 3/2017 | Dangler | ............ | H05K 1/0275 |
| 2020/0112030 A1 * | 4/2020 | Panat | ............ | H01M 4/38 |

* cited by examiner

RESILIENT MICRO LATTICE ELECTRICAL INTERCONNECTION ASSEMBLY

CROSS REFERENCE TO RELATED APPLICATIONS

The present application is a divisional application of U.S. patent application Ser. No. 16/118,892, filed Aug. 31, 2018, entitled "RESILIENT MICRO LATTICE ELECTRICAL INTERCONNECTION ASSEMBLY", which is a divisional application of U.S. patent application Ser. No. 15/007,743, filed Jan. 27, 2016 (now U.S. Pat. No. 10,104,773, issued Oct. 16, 2018), entitled "RESILIENT MICRO LATTICE ELECTRICAL INTERCONNECTION ASSEMBLY", the entire contents of which are incorporated herein by reference.

BACKGROUND

This invention generally relates to electrical connections and more specifically relates to establishing a resilient conductive connection between two parallel spaced-apart surfaces, e.g. printed circuit boards.

Modern electronics often contain circuitry formed on a plurality of stacked printed circuit boards (PCB). In many situations, there exists a need to couple an electrical signal from circuitry on one PCB to another PCB. One straightforward approach is to connect the ends of a wire or coaxial cable between the respective areas on the two PCBs. In another approach, a plurality of rigid perpendicular conductive pins extend from one PCB and are in alignment with corresponding receptacles or holes in the other PCB to establish electrical connections that may or may not be soldered after the connections are engaged.

Conventional metal springs disposed between PCBs have also been utilized to establish connections with respectively aligned contacts on adjacent parallel PCBs. However, such interconnections are normally time-consuming to install and may be tedious to assemble. Additionally, disassembly of such connected PCBs for maintenance or repair of the circuitry may result in even greater difficulties where such interconnections and careful alignment are required to be manually reestablished during reassembly of the respective PCBs. Thus, there exists a need for an improved electrical interconnection that facilitates ease of initial assembly and also provides for easy reassembly following a disassembly of the respective PCBs for maintenance or repair.

SUMMARY

It is an object of the present invention to satisfy this need.

An exemplary apparatus includes a base board with a conductive area on its external surface and can make a resilient electrical connection with another surface. A resilient, conductive, three dimensional, micro lattice truss has a first end permanently attached to the conductive area. The truss extends substantially perpendicular from the base board and has a second distal end. An unengaged state of the apparatus occurs when the second distal end of the truss is not in engagement with the other surface and the truss is not compressed in a direction towards the base board. An engaged state of the apparatus occurs when the second distal end of the truss engages the other surface and the truss is compressed a direction towards the base board. In the engaged state, the truss establishes an electrical connection between the conductive area on the base board and the other surface.

An exemplary method for making an electrical interconnector disposed on a first PCB includes using three dimensional printing to form a micro lattice truss structure from a bath of material. An external planar surface of the first PCB has a conductive area disposed within the bath of material. A first end of the truss structure is formed in contact with the conductive area so that the truss structure is adhered to the conductive area due to the three dimensional printing. The micro lattice truss structure extends outward away from the first PCB and has a second distal end opposing the first end. The micro lattice truss structure is formed with resiliency so that the truss structure maintains structural integrity during moderate compression of its second end towards the first end. The resiliency of the micro lattice truss structure enables the truss structure to return to substantially its uncompressed length when the compression is removed. The micro lattice truss structure is conductive so that a resilient electrical connection can be formed between the conductive area of the first PCB and another spaced apart surface parallel with the first PCB when the second distal end of the truss structure is in contact with and compressed by the other surface.

DESCRIPTION OF THE DRAWINGS

Features of exemplary implementations of the invention will become apparent from the description, the claims, and the accompanying drawings in which:

DETAILED DESCRIPTION

One aspect of the present invention resides in the recognition of the difficulties associated with the installation, assembly and reassembly of other interconnect mechanisms for coupling signals between adjacent surfaces/PCBs disposed parallel to each other in different planes. It was recognized that by manufacturing a resilient conductive micro lattice connector as part of one of the surfaces to be connected, the tediousness in the assembly with other surfaces/PCBs would be substantially eliminated and the time required for assembly would be significantly reduced. Additionally, difficulties associated with the manual reassembly of the respective PCBs following separation of the PCBs for maintenance or repair would be much reduced. It was further recognized that using 3D printing to initially form a nonconductive micro lattice connector on the surface and later plating it with a conductive material would provide a flexible and economical approach to making a conductive micro lattice connector assembly.

Figure 1:
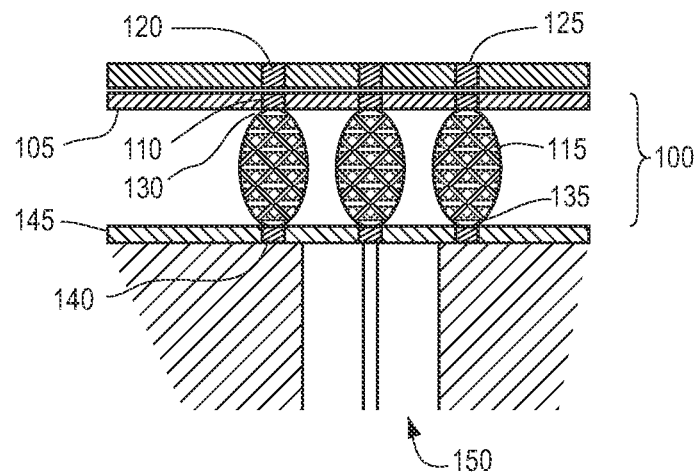
FIG. 1 illustrates an exemplary micro lattice connector assembly installed to establish electrical connection between circuitry on two spaced apart surfaces.

FIG. 1 shows an exemplary micro-lattice connection assembly 100 which includes a PCB 105 having a plurality of conductive plated through holes 110 and a conductive micro-lattice truss 115. As used herein, a micro-lattice truss is a three dimensional structure of interconnected strands. Layers of such trusses may be used to form various lengths. However, a conventional helical wound spring is not a micro-lattice truss. Another PCB 125, being in a plane substantially parallel to that of PCB 105, has a plurality of conductive plated through holes 120 that are aligned with plated through holes 110. A connection between the plated through holes on PCB 105 and 125 can be made in a variety of conventional ways, e.g. soldering. The micro-lattice truss 115 has one end 130 that is permanently attached to PCB 115 and another distal end 135. In this illustrative example, another parallel PCB 145 has a plurality of plated through holes 140 aligned to be engaged by the distal end 135 of the truss 115 in the assembled state. The PCB 145 may contain a variety of circuitry connected to the plated through holes 140, e.g. in this example strip line 150 is connected to the respective plated through holes 140. In the assembled state as shown in FIG. 1, the micro-lattice connection assembly 100 is used to provide a connection between circuitry on PCB 125 associated with plated through holes 120 and circuitry on PCB 145 associated with plated through holes 140. In this example the resilient conductive micro-lattice trusses 115 have sides parallel to the longitudinal axis of the trusses that are bowed outwardly indicating that the trusses are engaged and in compression between PCB 105 and 145 so that the respective ends 135 of each truss firmly engage the respective plated through holes 14 in order to establish a good electrical connection with very little ohmic resistance. Although PCBs are referred to in the described embodiment, the subject invention is suitable for providing interconnections between a variety of parallel surfaces.

Figure 2:
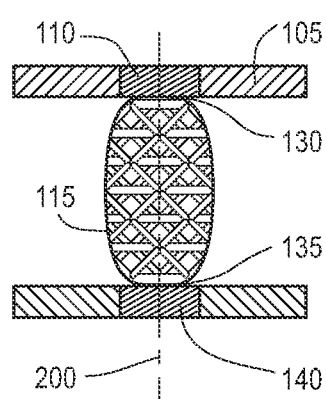
FIG. 2 illustrates an exemplary micro lattice connector in an assembled position.

FIG. 2 shows an enlarged view of the exemplary micro-lattice connection assembly showing only a single truss 115 in which the distal end 135 is in engagement with plated through hole 140 of PCB 145. A longitudinal axis 200 is shown with respect to truss 115. The width of truss 115 transverse to axis 200 and equidistant between PCB 105 and 145 is significantly greater than the width of the truss at either the attached end 130 or the distal end 135. Because the truss is resilient, this indicates that the truss is under compression along axis 200.

Figure 3:
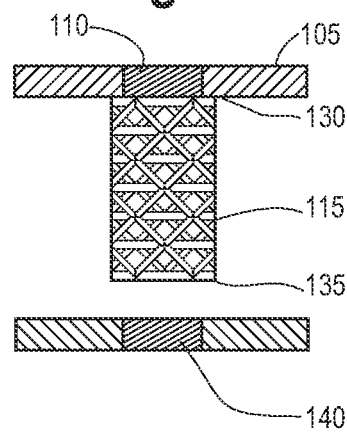
FIG. 3 illustrates an exemplary micro lattice connector in an unassembled position.

FIG. 3 shows an enlarged view of the exemplary micro-lattice connection assembly showing only a single truss 115 in an unassembled state. That is, the distance between PCB 105 and PCB 145 is greater than the fully extended length of truss 115 in an uncompressed state. In this illustrative example, the side view of the truss 115 presents a substantially rectangular profile. The distal end 135 is generally planar and disposed in a plane substantially parallel to that of PCB 145. This maximizes the surface of contact between the truss 115 and the plated area 140 of PCB 145 in an assembled state. Similarly, the end 130 of truss 115 is substantially parallel to PCB 105 so as to enhance the surface area of contact between the end 130 in the plated through hole 110. Although the exemplary embodiment shows plated through holes in PCBs as areas of engagement for the truss 115, it will be apparent that the exemplary truss can provide a conductive connection between any types of surfaces.

Figure 4:
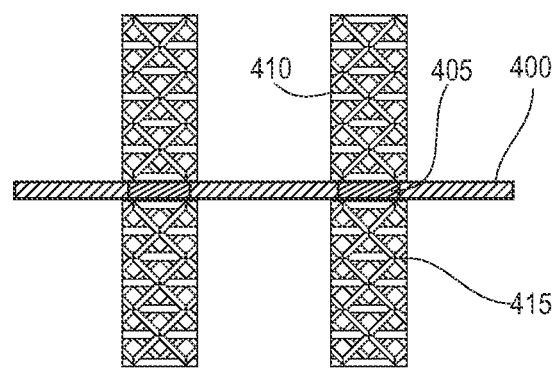
FIG. 4 illustrates another embodiment of a micro lattice connector assembly.
Figure 5:
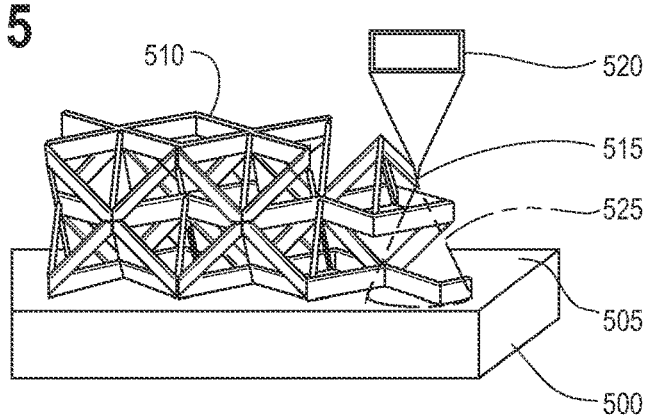
FIG. 5 illustrates an initial step in the fabrication of an exemplary micro lattice connector in accordance with the present invention.

FIG. 4 shows an alternative embodiment of a micro-lattice connection assembly comprising a PCB 400 with plated through holes 405 and opposing micro-lattice trusses 410 and 415 extending from the opposing surfaces of plated through holes 405 on PCB 400. This embodiment provides a suitable mechanism for interconnecting parallel areas on opposing surfaces in which the illustrated embodiment is sandwiched between the opposing surfaces and the surfaces moved close enough to each other so as to compress and engage the respective trusses 410 and 415.

FIGS. 5-8 provide assistance in understanding one exemplary method of manufacturing a micro lattice interconnect assembly. This exemplary method utilizes three-dimensional (3D) printing of a micro lattice truss structure 510 on a surface 505 of a support 500, e.g. PCB. More specifically, a two-photon polymerization (TPP) process can be utilized to deposit the truss structure on surface 505. This process utilizes rapid, ultrashort duration laser beams 520, 525 that focus on a point 515 causing the material at the point of focus to polymerize/solidify. For example, the TPP process may utilize femtosecond lasers that can reach powers up to 200 GW. Photoresist such as SU-8, PMMA, or PMGI could be utilized as the base material, i.e. the bed of material that is selectively solidified to form the lattice truss elements. The support 500 is placed in the bed of material so that an end portion of the truss structure is solidified/formed in contact with the surface 505.

The support 500 with surface 505 is coated or submerged in a bath of polymer where that material comes in direct contact with the support and surface 505. When that material is exposed to sufficient energy (such as two coherent laser beams) the material solidifies and is adhered in place on the surface 505 of the board/support 500. The conductive plating on this polymer, which is also adhered to surface 505, makes the electrical contact to the metallic surface 505 on the board.

Figure 6:
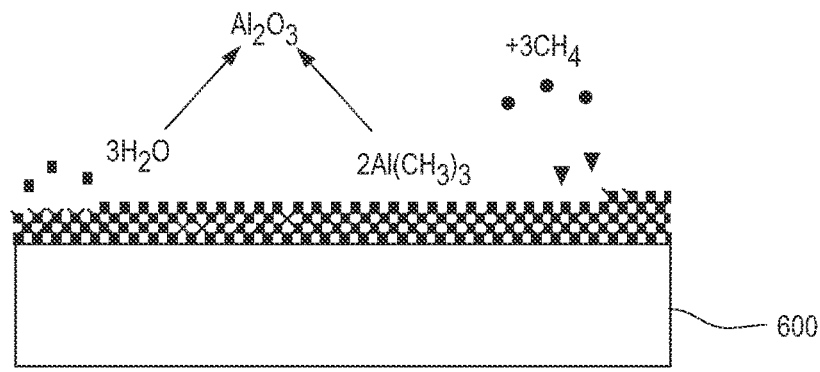
FIG. 6 is a representation of atomic layer deposition associated with an exemplary micro lattice connector.

FIG. 6 represents that once the entire micro lattice truss structure has been formed by 3D printing, the structure may then be subjected to an atomic layer deposition process. In this process the surface of the truss structure is subjected to an alternating gaseous species to deposit additional material. For example, the gases can be used to produce a monolayer formed from components of the gas on the surface of the structure. There could be two gases involved in the process with gas A depositing one layer, gas B depositing another layer, and then gas A would be used again, etc. A variety of gases could be used such as metal oxides (Aluminum Oxide, Titanium Oxide, etc), polymers (polyethylene, PMMA, etc), or pure metals (Au, Ag, Ta, Ti, etc). Depositing the material before plating ensures a consistent, clean surface with the desired dimensions.

Figure 7:
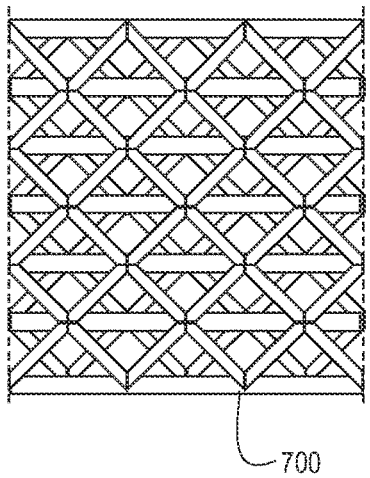
FIG. 7 illustrates an exemplary micro lattice connector that has been milled to a desired physical dimension.

FIG. 7 illustrates that the structure 700 is then side exposed and plasma etched such as with oxygen. Side exposure is the process of using a plasma to cut away at the sides of the lattice structure to a desired dimension and to expose the interior 3D printed strands adjacent the cut. This allows the plasma to etch away at the inside of the structure, i.e. the 3D printed material, without compromising the outside, plated material. The cut could be along the distal end of the lattice structure where the ends of the lattice strands will be in contact with the surface for which a connection is to be made. Plasma is one, but not the only, process that can be used to remove the 3D printed material. Preferably, a significant portion of the original 3D printed strands of the lattice are removed leaving only the conductive outer layer which will then resemble interconnected hollow tubes. Oxygen is a gas suitable for such plasma etching because it is low in cost and easy to obtain. The O2 plasma cleans well and is relatively simple to use. However, other elements could be used for etching, such as Argon or Hydrogen.

Figure 8:
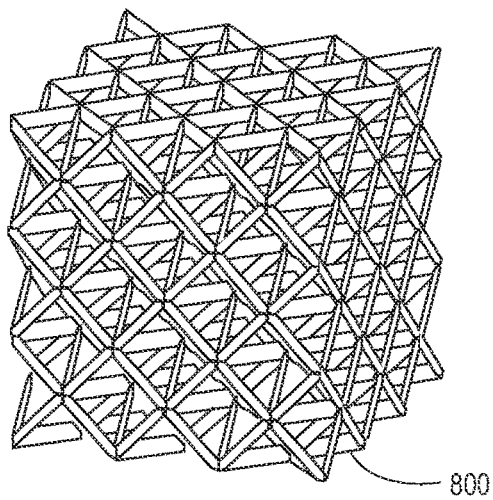
FIG. 8 illustrates a final structure of one embodiment of an exemplary micro lattice connector.

FIG. 8 represents a finished, base structure of a micro lattice truss 800. This structure is then made conductive by plating it with a conductive metal such as gold, copper, silver, nickel, Rhodium, etc. Also conductive non-metals such as metallic glass or carbon nanotubes could be utilized to coat the base structure with a conductive skin.

Figure 9:
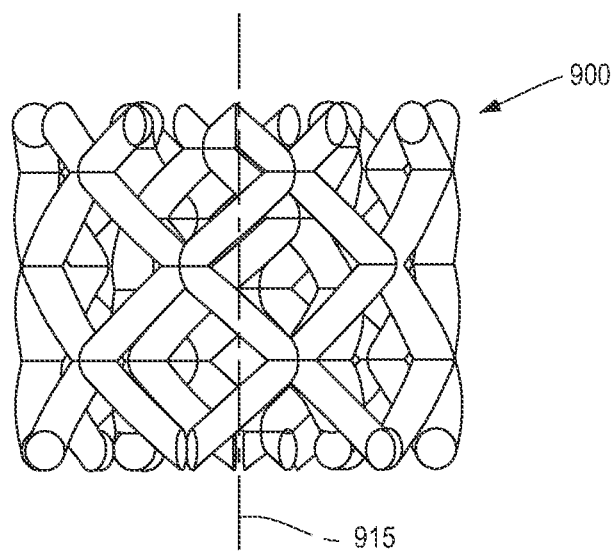
FIG. 9 shows a side elevational view of another embodiment of an exemplary micro lattice connector.
Figure 10:
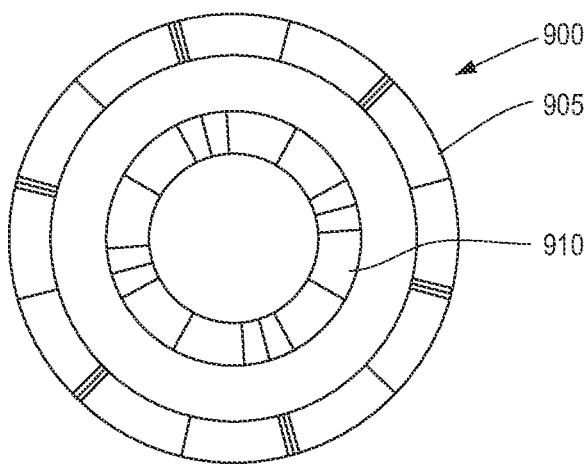
FIG. 10 shows a top view of the embodiment as shown in FIG. 9.

FIGS. 9-10 illustrate another embodiment of a micro lattice truss structure 900 having an outer concentric tube 905 and an inner concentric tube 910. Each of the inner and outer tubes are formed with longitudinal truss members extending along the longitudinal axis 915. The axial displacement of the micro lattice structure as described herein can accept large displacements (changes in physical dimension) along its axis with little to no distortion to its physical dimensions in the transverse direction. This is helpful in creating and maintaining a desired impedance for RF signal transmission, e.g. inner and outer concentric micro-lattice structures can be dimensioned for a desired impedance, based on materials and spacings, which is maintained both in and out of compression.

It will be understood that the micro lattice truss structure could have a variety of dimensions and properties while still providing the advantages discussed above. By way of example, and without limitation, each truss element/fiber could have a wall thickness of 0.0001 inch; each micro lattice truss structure could have 40% compliance relative to height; the weight of one entire micro lattice truss structure could be in the order of 10-20 grams; each micro lattice truss structure could have a conductivity in the order of $40-70 \times 10^6$ Siemens/m; each micro lattice truss structure could have a longitudinal length of 5-20 mm.

Based on the teachings herein, it will be observed that there is a balance between contact pressure and compliancy. In an exemplary application, a compression of between 0.002" and 0.006" of compression (of a 0.010" tall contact) may be desired. It may be possible to achieve >75% compression without lasting damage to the micro-lattice structure. Compression, force, electrical resistance and resiliency need to be balanced. The truss should have enough repeating layers so that it is long enough to make contact with both surfaces. For micro-lattice structure of 0.010" in length, there could be 5 layers or more.

Even a lesser compression, e.g. 50%-60%, without damage and with substantially retained resiliency, could be utilized. Wall thickness is an important consideration with regard to the amount of deformation of the structure at different loads. For a structure with a 10 nm thick micro truss wall, it could experience a stress of up to 1.2 MPa with very high recoverability. On the other hand, a 50 nm thick micro truss wall would have more overall strength but would not be as recoverable. Hence, the wall thickness and length of the micro-lattice structure should be considered depending on the specific application. In one example with 0.002" minimum compression target, almost no permanent set is achieved, i.e. almost complete resiliency. It may be a design goal to stay in the compliant region where there will be no permanent set. Although exemplary implementations of the invention have been depicted and described in detail herein, it will be apparent to those skilled in the art that various modifications, additions, substitutions, and the like can be made without departing from the spirit of the invention. For example, a micro-lattice structure could be originally 3D printed using a conductive material that would result in solid metallic trusses/strands as opposed to hollow tubes. However, these solid 'conductive' materials may result in less desirable mechanical and electrical properties in comparison to substantially hollow conductive tubes.

The scope of the invention is defined in the following claims.

We claim:

1. An assembly in which electrical interconnections are made among parallel, spaced apart, printed circuit boards (PCBs) comprising:
    a first PCB with a conductive area on its surface;
    a resilient, conductive, three dimensional, micro lattice truss with a first end attached to the conductive area and a second distal end opposing the first end;
    the micro lattice truss extending about an axis perpendicular to and outward from the first PCB;
    a second PCB having a conductive area on a surface facing the first PCB;
    the micro lattice truss being in a compressed and engaged state due to the second distal end of the micro lattice truss engaging the conductive area on the second PCB and the micro lattice truss is subject to a force in an end-to-end direction, the micro lattice truss in the compressed state establishes an electrical connection between the conductive area on the first PCB and the conductive area on the second PCB;
    the micro lattice truss being a stack of three or more layers where each layer contains elongated strands that have respective ends that terminate at two spaced-apart parallel planes that define boundaries of each layer of the micro lattice truss, the planes being perpendicular to the axis, each layer having the ends of the elongated strands being connected in a fixed manner at each interlayer boundary to respective ends of elongated strands in an adjacent layer, the strands being resilient and having ends that are affixed to the respective end two other strands in the same layer, one strand of the two other strands being within a plane that is different from the plane containing the other of the two other strands.

2. The assembly of claim 1 wherein the resiliency of the micro lattice truss enables the micro lattice truss to return to at least 70% of its original unengaged length perpendicular to the first PCB following a transition from the engaged state to an unengaged state.

3. The assembly of claim 1 wherein the first end of the micro lattice truss is permanently attached to the conductive area on the first PCB by the first end having been originally grown in direct contact with the conductive area on the first PCB.

* * * * *

UNITED STATES PATENT AND TRADEMARK OFFICE
CERTIFICATE OF CORRECTION

| | | |
|---|---|---|
| PATENT NO. | : 12,028,978 B2 | Page 1 of 1 |
| APPLICATION NO. | : 17/397314 | |
| DATED | : July 2, 2024 | |
| INVENTOR(S) | : Pirih et al. | |

It is certified that error appears in the above-identified patent and that said Letters Patent is hereby corrected as shown below:

In the Claims

In Column 6, Claim 1, Line 44, delete "end" and insert -- ends of --, therefor.

Signed and Sealed this
Sixth Day of August, 2024

Katherine Kelly Vidal
*Director of the United States Patent and Trademark Office*